United States Patent
Lee

(10) Patent No.: US 7,004,759 B2
(45) Date of Patent: Feb. 28, 2006

(54) MODULES HAVING A PLURALITY OF CONTACTS ALONG EDGES THEREOF CONFIGURED TO CONDUCT SIGNALS TO THE MODULES AND FURTHER HAVING A PLURALITY OF CONTACTS ALONG EDGES THEREOF CONFIGURED TO CONDUCT SIGNALS FROM THE MODULES

(75) Inventor: Dong-yang Lee, Kyungki-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/792,475

(22) Filed: Mar. 3, 2004

(65) Prior Publication Data

US 2004/0209490 A1    Oct. 21, 2004

(30) Foreign Application Priority Data

Apr. 15, 2003  (KR) ...................... 10-2003-0023736

(51) Int. Cl.
*H01R 12/00*  (2006.01)
(52) U.S. Cl. ........................................................ 439/55
(58) Field of Classification Search ................ 711/115; 439/55, 924.1
See application file for complete search history.

(56) References Cited

U.S. PATENT DOCUMENTS

| | | | |
|---|---|---|---|
| 6,234,807 B1 * | 5/2001 | Amini et al. .................. | 439/60 |
| 6,379,193 B1 * | 4/2002 | Fujii et al. ................... | 439/680 |
| 6,414,868 B1 * | 7/2002 | Wong et al. ................... | 365/51 |
| 6,767,252 B1 * | 7/2004 | McGrath et al. ............ | 439/637 |
| 6,819,625 B1 * | 11/2004 | Ruckerbauer et al. ...... | 365/233 |

FOREIGN PATENT DOCUMENTS

KR       20-0266904 Y1    2/2002

OTHER PUBLICATIONS

Notice to Submit Response (with English language translation), Korean App. 10-2003-0023736, May 30, 2005.

* cited by examiner

*Primary Examiner*—Ross Gushi
(74) *Attorney, Agent, or Firm*—Myers Bigel Sibley & Sajovec

(57) ABSTRACT

The present invention provides a module comprising a circuit board, a plurality of first contacts adjacent to an edge of the circuit board configured to conduct a plurality of signals to the module and a plurality of second contacts adjacent to the edge of the circuit board configured to receive the plurality of signals from the module to outside the module. Memory modules, sockets, circuit boards, and systems are also provided.

13 Claims, 6 Drawing Sheets

−1333Mbps−

MODULE 330

−1333Mbps−

MODULES HAVING A PLURALITY OF CONTACTS ALONG EDGES THEREOF CONFIGURED TO CONDUCT SIGNALS TO THE MODULES AND FURTHER HAVING A PLURALITY OF CONTACTS ALONG EDGES THEREOF CONFIGURED TO CONDUCT SIGNALS FROM THE MODULES

CROSS REFERENCE TO RELATED APPLICATION

This application claims priority from Korean Patent Application No. 2003-23736, filed Apr. 15, 2003, the disclosure of which is hereby incorporated by reference in its entirety.

BACKGROUND OF THE INVENTION

1. Field of the Invention

The present invention relates to circuit boards, and more particularly, to contacts on printed circuit boards.

2. Description of the Related Art

To meet the increase in signal transmission speeds of digital circuits having semiconductor-integrated circuit devices, a low-voltage interfacing technique has been developed, in which signals with a low voltage of 1V or less are transmitted.

In particular, as operating speeds of semiconductor integrated circuit devices increase, signals have sharper edges, i.e., the signal transition times decrease. Consequently, waveform distortion arises from unmatched impedance. To reduce waveform distortion, a matched termination method has been widely used, in which a bus is terminated with a line impedance.

FIG. 1 presents a schematic illustrating a general wiring scheme. The reference numeral 100 denotes a printed circuit board also referred to as a "circuit board", "system board", "backboard" or a "backplane". The backboard 100 can include connectors or sockets 41 and 42 which connect modules 1 and 2 to a bus 10 connected to a control unit 110. The sockets 41 and 42 can be connected with each other via the bus 10. The bus 10 can be terminated with a termination resistor or a terminator Rtt 200 and a termination voltage Vtt 300 to provide a matched termination.

Modules 1 and 2 are representative functional circuit boards or memory modules that are capable of transmitting data to or receiving data from functional circuits disposed on the backboard 100 or memory devices 31 and 32 via the bus 10. The memory devices 31 and 32 can be connected to the bus 10 through wiring or stub buses 11 and 12.

In the general wiring scheme of FIG. 1, the line lengths of the stub buses 11 and 12 are at a length such that signals having high speed falling or rising transition times conducted thereon may exhibit negative characteristics. For example, an unmatched impedance on the stub bus may distort the waveforms conducted thereon.

FIGS. 2A through 2C illustrate representative waveforms of signals of the memory devices 31 and 32 according to the operating frequency of the wiring scheme of FIG. 1. Referring to FIG. 2A, in a situation where the operating frequency of the wiring scheme of FIG. 1 is, for example, 533 Mega bits per second (Mbps), the waveforms of signals of the memory devices 31 and 32 can be relatively stable. Referring to FIG. 2B, in a situation where the operating frequency of the circuit system of FIG. 1 is, for example, 667 Mbps, the waveforms of signals of the memory devices 31 and 32 can be skewed and/or distorted. Referring to FIG. 2C, in a situation where the operating frequency of the circuit system of FIG. 1 is, for example, 800 Mbps, the waveforms of signals of the memory devices 31 and 32 can be severely distorted.

Accordingly, central processing unit (CPU) performance improvement may require memory performance improvement. Memory devices, for example, double data rate synchronous dynamic Random Access Memory (DDR SDRAMs) generally have the operating frequency of about 533 Mbps or about 667 Mbps. Thus, the wiring scheme of FIG. 1 can prevent distortion. However, it is difficult to implement a next-generation dynamic Random Access Memory (DRAM) with the operating frequency of at least about 800 Mpbs or about 1333 Mbps using the general wiring scheme of FIG. 1, i.e., a stub bus interface.

SUMMARY OF THE INVENTION

Embodiments according to the present invention can provide modules comprising a circuit board, a plurality of first contacts adjacent to an edge of the circuit board configured to conduct a plurality of signals to the module and a plurality of second contacts adjacent to the edge of the circuit board configured to receive the plurality of signals from the module to outside the module.

In other embodiments, the modules comprise a circuit board, a plurality of first contacts adjacent to an edge of the circuit board having a first spacing therebetween and configured to conduct a plurality of signals to the module and a plurality of second contacts adjacent to the edge having a second spacing therebetween relative to the plurality of first contacts.

In some embodiments according to the present invention, the modules comprise a circuit board, a plurality of first contacts adjacent to an edge of the circuit board and configured to conduct a plurality of signals to the module, wherein an edge of at least one of the plurality of first contacts is spaced apart from the edge of the circuit board by a first distance and a plurality of second contacts adjacent to the edge, wherein an edge of at least one of the plurality of second contacts is spaced apart from the edge of the circuit board by a second distance.

Pursuant to further embodiments, the present invention provides sockets configured to be mounted on a circuit board and configured for insertion of a module therein, the socket comprising a plurality of first socket contacts configured to electrically connect a plurality of first conductive lines on the circuit board to a plurality of first contacts adjacent to an edge of the module when the module is inserted into the socket, and a plurality of second socket contacts configured to electrically connect a plurality of second conductive lines from the plurality of first contacts to a plurality of second contacts adjacent to the edge of the module when the module is inserted into the socket.

Additional embodiments of the present invention provide circuit boards comprising a plurality of conductive layers in the circuit board, a plurality of insulative layers in the circuit board, a plurality of conductive lines in the circuit board on the insulative layers, a socket configured to be mounted on the circuit board and a module configured to be removeably coupled to the socket, wherein the module comprises a plurality of first contacts adjacent to an edge of the circuit board configured to conduct a plurality of signals to the module and a plurality of second contacts adjacent to the edge of the circuit board configured to receive the plurality of signals from the module to outside the module.

Further embodiments of the present invention provide systems comprising a control unit configured to conduct signals and a module configured to receive signals at a plurality of first contacts at an edge of the module and configured to conduct the signals to a plurality of second contacts at the edge.

DETAILED DESCRIPTION OF EMBODIMENTS ACCORDING TO THE INVENTION

Figure 1:
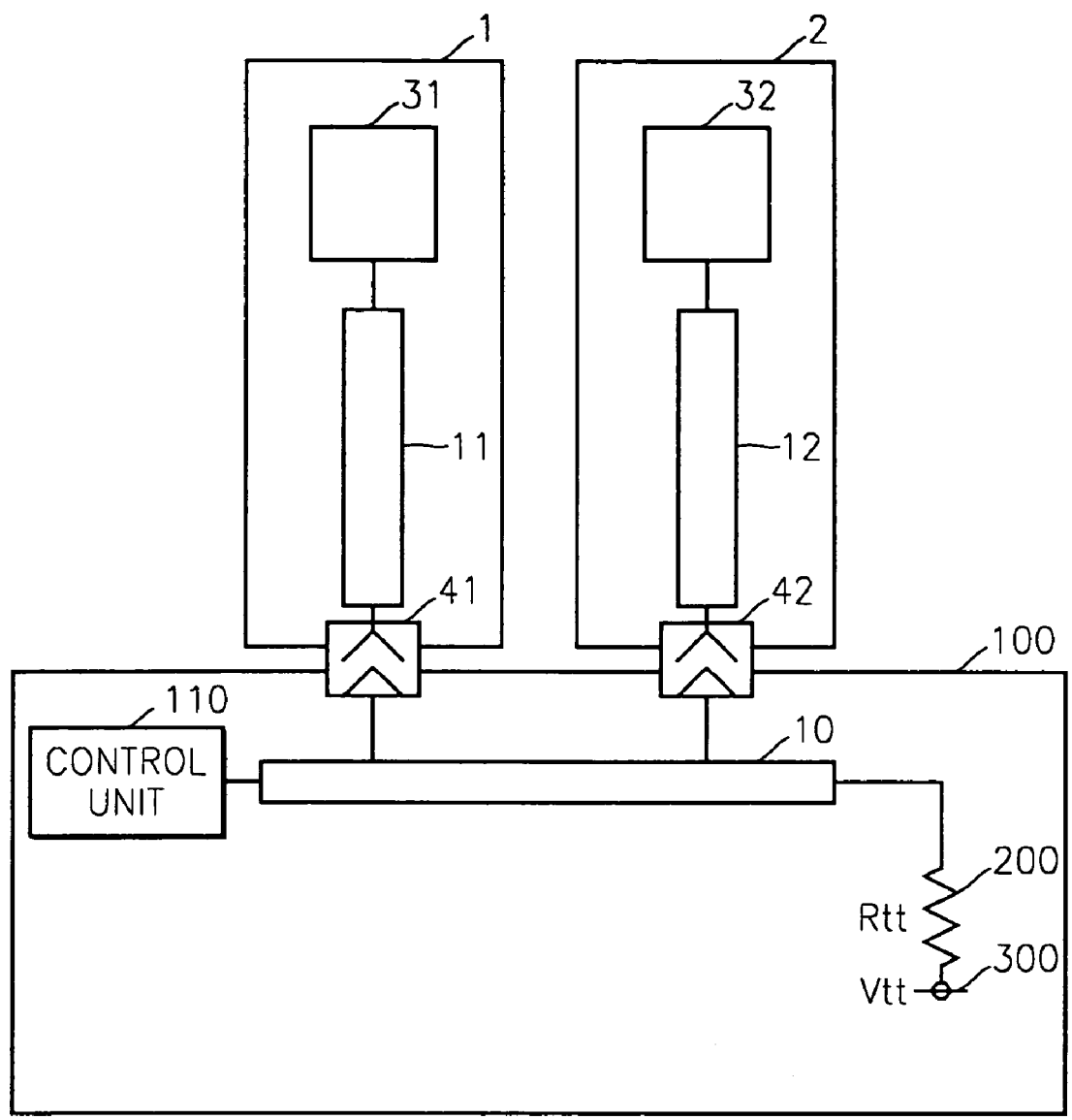
FIG. 1 presents a schematic illustrating a general wiring scheme.

The present invention will now be described more fully herein with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art.

The terminology used in the description of the invention herein is for the purpose of describing particular embodiments only and is not intended to be limiting of the invention. As used in the description of the embodiments of the invention and the appended claims, the singular forms "a", "an" and "the" are intended to include the plural forms as well, unless the context clearly indicates otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that relative terms are intended to encompass different orientations of the device in addition to the orientation depicted in the Figures.

Moreover, it will be understood that although the terms first and second are used herein to describe various features, elements, regions, layers and/or sections, these features, elements, regions, layers and/or sections should not be limited by these terms. These terms are only used to distinguish one feature, element, region, layer or section from another feature, element, region, layer or section. Thus, a first feature, element, region, layer or section discussed below could be termed a second feature, element, region, layer or section, and similarly, a second without departing from the teachings of the present invention.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Further, as used herein the term "plurality" refers to at least two elements. Additionally, like numbers refer to like elements throughout.

As will be appreciated by one of skill in the art, the present invention may be embodied as devices and methods of making and using such devices. Modules according to the present invention as illustrated, for example, in FIG. 7, can include a circuit board, a plurality of first contacts adjacent to an edge of the circuit board configured to conduct a plurality of signals to the module and a plurality of second contacts adjacent to the edge of the circuit board configured to receive the plurality of signals (not shown) from the module to outside the module.

In some embodiments, the plurality of first contacts has a first spacing therebetween and the plurality of second contacts has a second spacing therebetween relative to the plurality of first contacts. In some embodiments, an edge of at least one of the plurality of first contacts can be spaced apart from the edge of the circuit board by a first distance and an edge of at least one of the plurality of second contacts can be spaced apart from the edge of the circuit board by a second distance. In further embodiments, the module can be a memory module. In other embodiments, the plurality of signals conducted to the module can include clock signals (CLK) or data signals (DATA). The data signals (DATA) can include data signals having a frequency of at least about 800 Mbps. Additionally, the data signals (DATA) can include data signals having a frequency in a range between about 800 Mbps and about 1333 Mbps. In still other embodiments, the module can further include a plurality of third contacts adjacent to the edge coupled to stub buses on the circuit board configured to conduct a plurality of address signals (ADD) or command signals (CMD). A single one of the plurality of third contacts can be dedicated to a single one of the plurality of address signals (ADD) or command signals (CMD).

Figure 3:
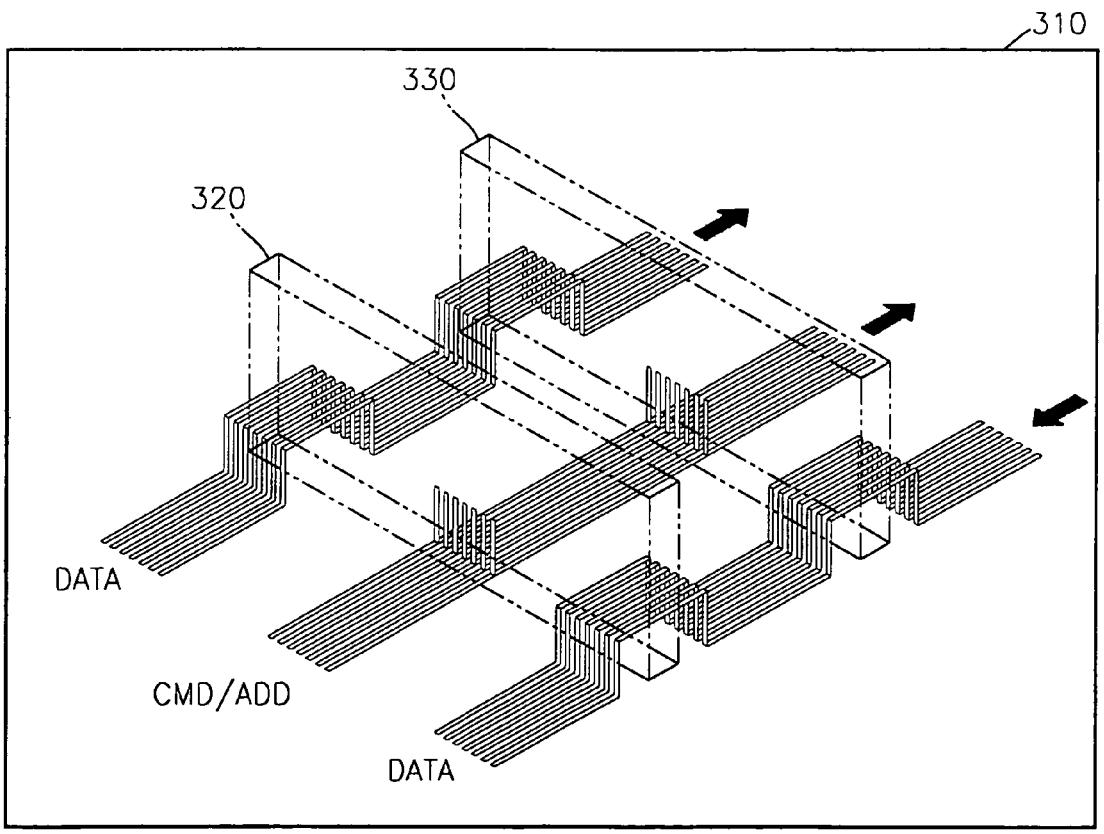
FIG. 3 illustrates modules according to some embodiments of the present invention.

Referring to FIG. 3, first and second memory modules 320 and 330 can be mounted on a circuit board 310. Data signals (DATA) and command/address signals (CMD/ADD) are connected to memory devices (not shown) on the first memory module 320 and the second memory module 330 via bus lines. The data signals (DATA) are input to and output from the first memory module 320 and the second memory module 330. The DATA signals can also include clock signals (CLK). The command/address signals (CMD/ADD) are input to the first memory module 320 and the second memory module 330 with stub buses.

Figure 5A:
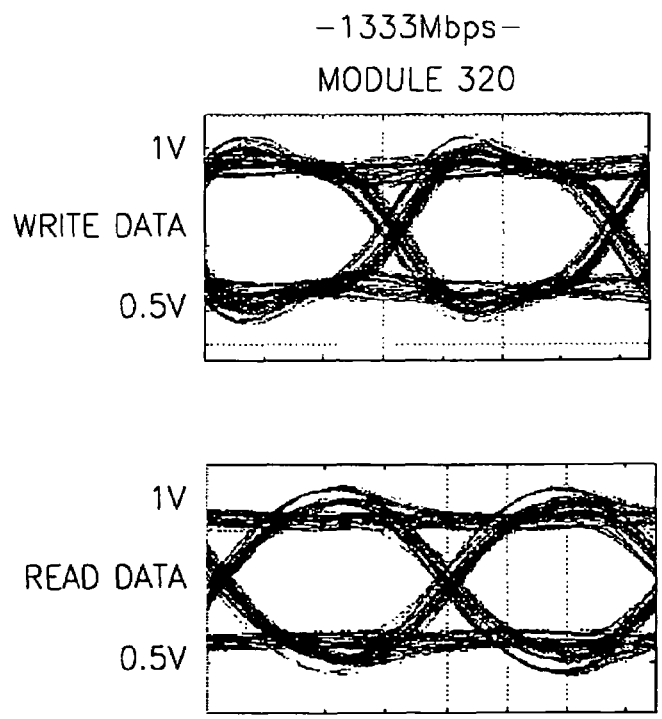
FIGS. 5A and 5B illustrate exemplary waveforms of signals when a module of FIG. 3 operates at a high frequency.
Figure 5B:
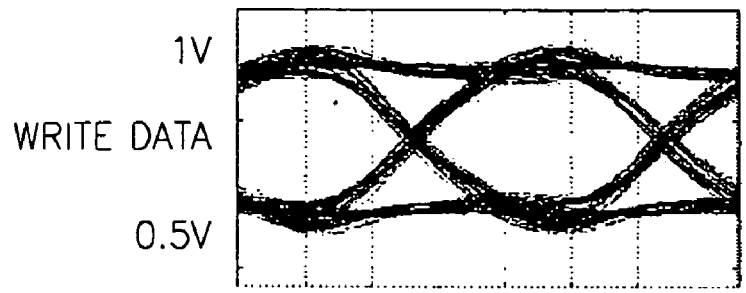
Figure 5B:
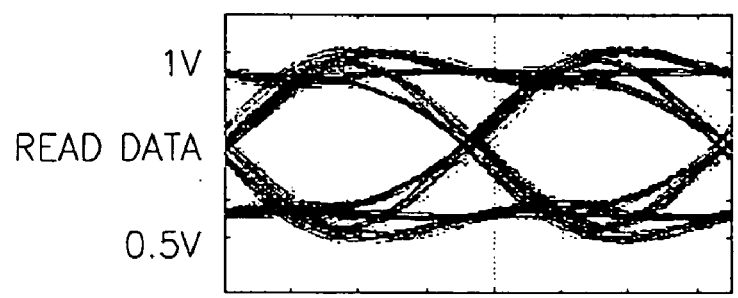

According to FIG. 3, the first memory module 320 and the second memory module 330 each include input contacts and output contacts for respective data signals (DATA). Thus, the number of contacts of the first memory module 320 and the second memory module 330 increases. As a result, the number of contacts of sockets in which the first memory module 320 and the second memory module 330 are inserted also increases. Such structures of the first memory module 320 and the second memory module 330 may increase the size of the backboard 310 on which sockets can be mounted or occupy a large area of the backboard 310. Such structures can be advantageous in that they may improve the stability of waveforms without (or reducing) signal distortion when the first memory module 320 and the second memory module 330 operate at a high frequency, e.g., 1333 Mbps, as shown in FIGS. 5A and 5B. Referring again to FIG. 3, in the first memory module 320 and the second memory module 330, slower signals such as the command/address signals (CMD/ADD) can be interfaced using stub buses, and fast signals such as the clock signals (CLK) and the data signals (DATA) can be interfaced using separate input buses and output buses.

In some embodiments, the module includes a circuit board, a plurality of first contacts adjacent to an edge of the circuit board having a first spacing therebetween and configured to conduct a plurality of signals to the module and a plurality of second contacts adjacent to the edge having a second spacing therebetween relative to the plurality of first contacts. The second spacing can be less than the first spacing. An edge of at least one of the plurality of first contacts can be spaced apart from the edge of the circuit board by a first distance and an edge of at least one of the plurality of second contacts can be spaced apart from the edge of the circuit board by a second distance. The plurality of signals conducted to the module can include clock signals (CLK) or data signals (DATA). The plurality of second contacts can be coupled to stub buses on the circuit board configured to conduct a plurality of address signals (ADD) or command signals (CMD). The data signals (DATA) can include data signals having a frequency of at least about 800 Mbps. The data signals (DATA) can include data signals having a frequency in a range between about 800 Mbps and about 1333 Mbps. In certain embodiments, the module can include a memory module.

Figure 4:
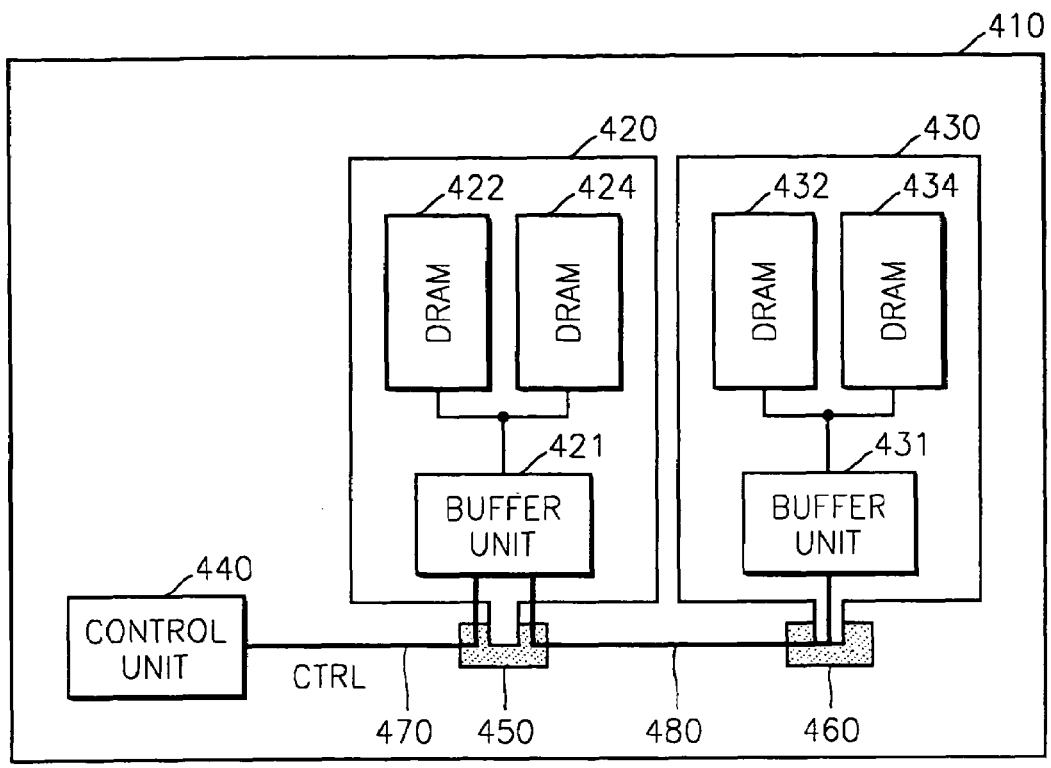
FIG. 4 illustrates a block diagram of a system according to some embodiments of the present invention.

FIG. 4 illustrates a system including a memory module according to an embodiment of the present invention. A backboard 410 includes a first memory module 420 and a second memory module 430, a control unit 440, first sockets 450, and second sockets 460. The first memory module 420 includes two memory devices, i.e., DRAMs 422 and 424 and a buffer unit 421. The second memory module 430 includes two memory devices, i.e., DRAMs 432 and 434 and a buffer unit 431. The first memory module 420 is mounted on the socket 450 and connected to the control unit 440 via a bus line 470. The second memory module 430 is mounted on the socket 460 and connected to the control unit 440 via the bus line 470. The output signal of the control unit 440, e.g., a control signal (CTRL) is connected to the buffer unit 421 of the first memory module 420 and the buffer unit 431 of the second memory module 430 via the bus lines 470 and 480. The buffer unit 421 connected to the DRAMs 422 and 424 receives the control signal (CTRL) from the control unit 440 via the bus line 470 and outputs the control signal (CTRL) to the bus line 480. The buffer unit 431 connected to the DRAMs 432 and 434 receives the control signal (CTRL) from the buffer unit 421 via the bus line 480.

Figure 2A:
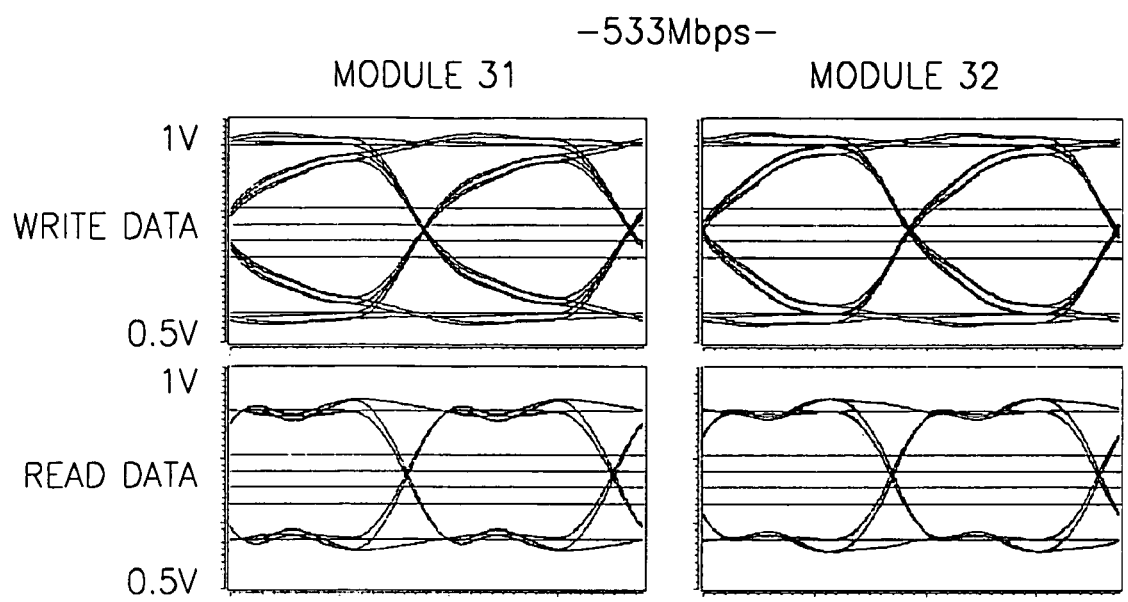
FIGS. 2A through 2C illustrate exemplary waveforms of signals according to an operating frequency of the general wiring scheme of FIG. 1.
Figure 2B:
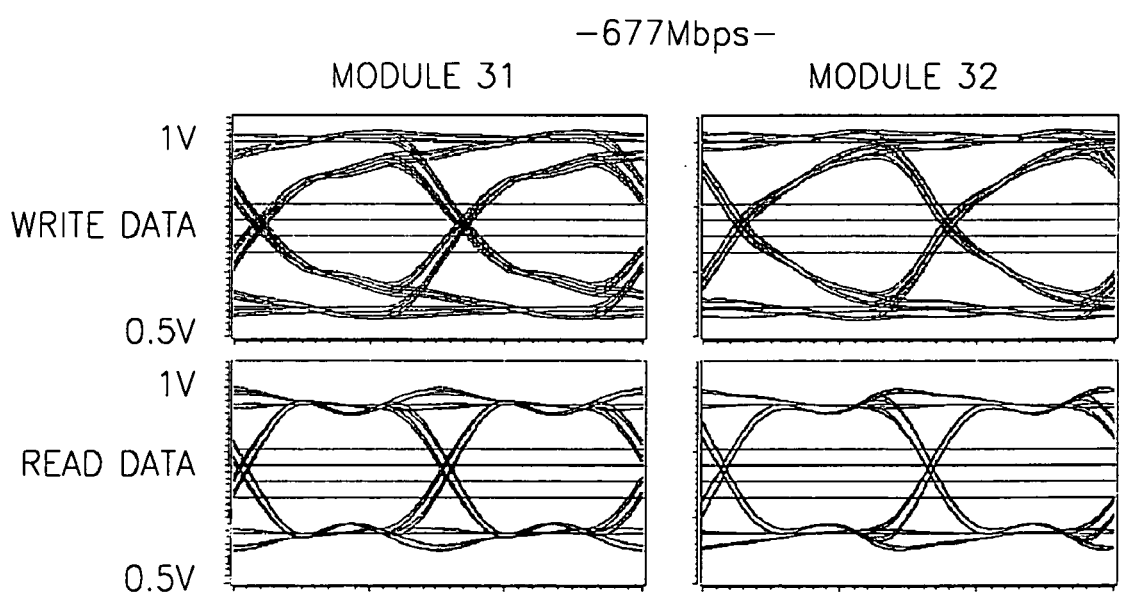
Figure 2C:
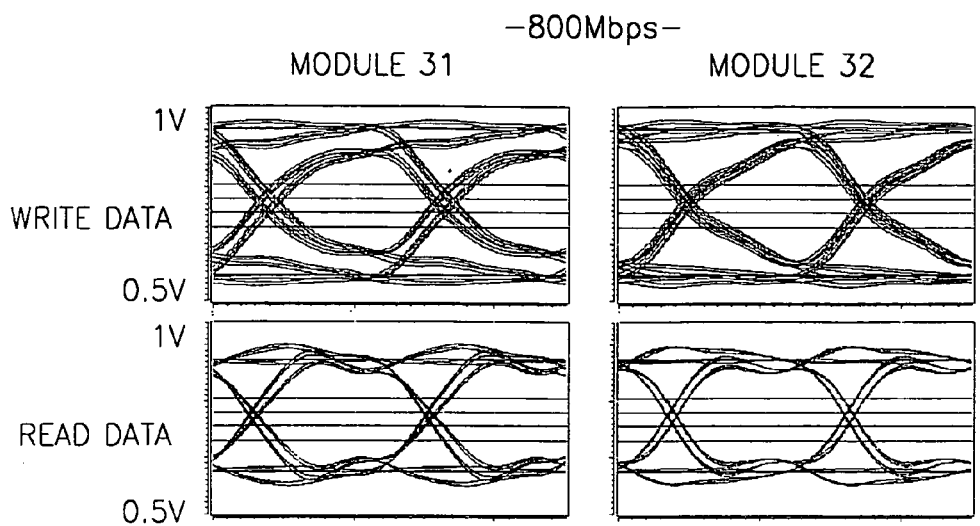
Figure 6:
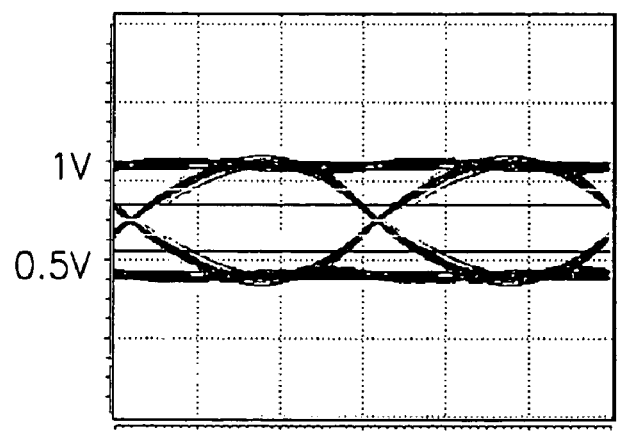
FIG. 6 illustrates exemplary waveforms of signals when a module of FIG. 4 operates at a high frequency.

Exemplary waveforms of signals of the first memory module 420 or the second memory module 430 are shown in FIG. 6. Referring to FIG. 6, the waveforms can be more stable than those of FIG. 2C even though the first memory module 420 or the second memory module 430 operates at a high frequency of 1333 Mpbs, which is higher than 800 Mbps of FIG. 2C.

Therefore, in this embodiment, the first memory module 420 or the second module 430 can operate at a high frequency using a point-to-point net structure.

Figure 7:
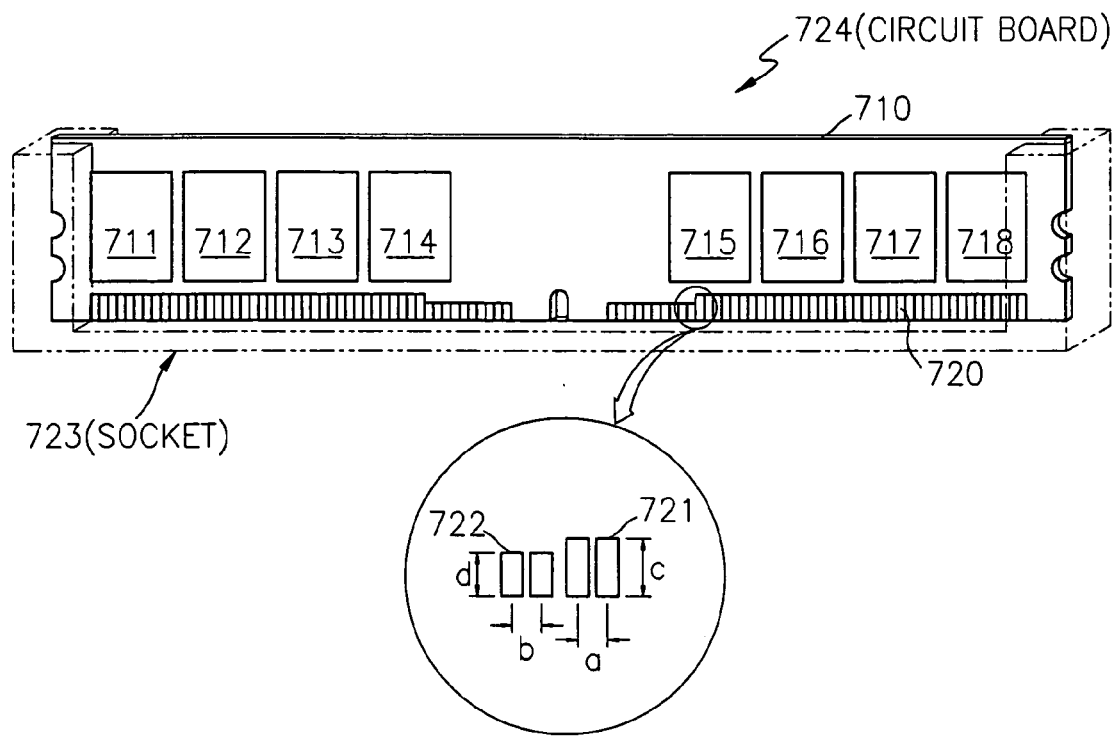
FIG. 7 illustrates modules and sockets according to some embodiments of the present invention.
Figure 8:
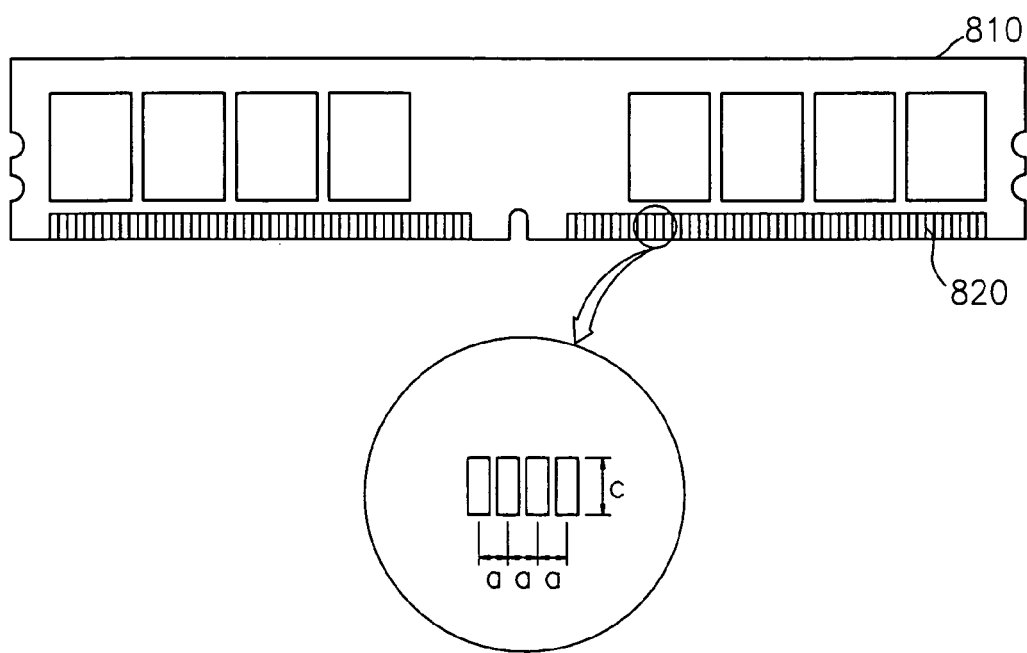
FIG. 8 illustrates a conventional module.

Referring to FIG. 7, a memory module 710 includes a plurality of memory devices, e.g., DRAMs 711, 712, 713, 714, 715, 716, 717, and 718, and module contacts 720 having different sizes and/or spacing (or pitch). The module contacts 720 having different sizes are different from module contacts 820 having a specific height c and a specific pitch a as shown in FIG. 8. In an enlarged picture of the module contacts 720, heights c of first contacts 721 and heights d of second contacts 722 are different from each other. The heights c of the first contacts 721 are higher than the heights d of the second contacts 722. As described with reference to FIG. 1, signals that may otherwise suffer reduced signal integrity at high speed due to unmatched impedance can be connected to the second contacts 722. For example, the clock signals (CLK) and the data signals (DATA) can be connected to the second contacts 722. The command/address signals (CMD/ADD) can be connected to the first contacts 721.

The pitch b of the second contacts 722 is less than pitch a of the first contacts 721. Thus, the number of second contacts 722 that can be placed in the memory module 710 increases. In addition, a height of a socket in which the second contacts 722 are inserted can be decreased for complete signal integrity.

In the embodiments shown in FIG. 7, the memory module 710 includes the first contacts 721 and the second contacts 722 that have different heights and pitches, but can include only the second contacts 722.

In some embodiments of the present invention, the module includes a circuit board, a plurality of first contacts adjacent to an edge of the circuit board and configured to conduct a plurality of signals to the module, wherein an edge of at least one of the plurality of first contacts can be spaced apart from the edge of the circuit board by a first distance (or height) and a plurality of second contacts adjacent to the edge, wherein an edge of at least one of the plurality of second contacts can be spaced apart from the edge of the circuit board by a second distance (or height). The second distance can be less than the first distance. The plurality of first contacts can have a first spacing therebetween and the plurality of second contacts can have a second spacing therebetween relative to the plurality of first contacts. The plurality of signals conducted to the module can include clock signals (CLK) or data signals (DATA). The plurality of second contacts can be coupled to stub buses on the circuit board configured to conduct a plurality of address or command signals. The data signals (DATA) can include data signals having a frequency of at least about 800 Mega bits per second. The data signals (DATA) can further include data signals having a frequency in a range between about 800 Mega bits per second (Mbps) and about 1333 Mbps. In some embodiments, the module includes a memory module.

In some other embodiments, a socket configured to be mounted on a circuit board and configured for insertion of a module therein is provided. The socket can include a plurality of first socket contacts configured to electrically connect a plurality of first conductive lines on the circuit board to a plurality of first contacts adjacent to an edge of the module when the module is inserted into the socket and a plurality of second socket contacts configured to electrically connect a plurality of second conductive lines from the plurality of first contacts to a plurality of second contacts adjacent to the edge of the module when the module is inserted into the socket. In some embodiments, the socket is a memory module socket.

In further embodiments, the present invention provides a circuit board comprising a plurality of conductive layers in the circuit board, a plurality of insulative layers in the circuit board, a plurality of conductive lines in the circuit board on the insulative layers, a socket configured to be mounted on the circuit board and a module configured to be removeably coupled to the socket, wherein the module can include a plurality of first contacts adjacent to an edge of the circuit board configured to conduct a plurality of signals to the module and a plurality of second contacts adjacent to the edge of the circuit board configured to receive the plurality of signals from the module to outside the module. The plurality of signals conducted to the module can include clock signals (CLK) or data signals (DATA); The data signals (DATA) can include data signals having a frequency of at least about 800 Mega bits per second. The data signals (DATA) can further include data signals having a frequency in a range between about 800 Mega bits per second (Mbps) and about 1333 Mbps. In some embodiments, the module can include a plurality of third contacts adjacent to the edge coupled to stub buses on the circuit board configured to conduct a plurality of address or command signals. A single one of the plurality of third contacts can be dedicated to a single one of the plurality of address or command signals. In some embodiments, the plurality of first contacts can have a first spacing therebetween and the plurality of second contacts can have a second spacing therebetween relative to the plurality of first contacts. An edge of at least one of the plurality of first contacts can be spaced apart from the edge of the circuit board by a first distance and an edge of at least one of the plurality of second contacts can be spaced apart from the edge of the circuit board by a second distance. In certain embodiments, the module includes a memory module.

Embodiments of the present invention further provide a module configured to receive signals at a plurality of first contacts at an edge of the module and configured to conduct the signals to a plurality of second contacts at the edge. The signals can include clock signals (CLK) or data (DATA) signals. The data signals (DATA) can include data signals having a frequency of at least about 800 Mega bits per second. The data signals (DATA) can further include data signals having a frequency in a range between about 800 Mega bits per second (Mbps) and about 1333 Mbps. In other embodiments, the module further includes the plurality of first contacts having a first spacing therebetween and the plurality of second contacts having a second spacing therebetween relative to the plurality of first contacts. In other embodiments, the module includes a memory module.

While the present invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A module comprising:
   a circuit board;
   a plurality of first contacts adjacent to an edge of the circuit board configured to conduct a plurality of signals to the module;
   a plurality of second contacts adjacent to the edge of the circuit board configured to receive the plurality of signals from the module to outside the module; and
   a plurality of third contacts adjacent to the edge coupled to stub buses on the circuit board configured to conduct a plurality of address signals or command signals, wherein a single one of the plurality of third contacts is dedicated to a single one of the plurality of address signals or command signals.

2. The module according to claim 1, wherein the plurality of first contacts has a first spacing therebetween and the plurality of second contacts has a second spacing therebetween relative to the plurality of first contacts.

3. The module according to claim 1, wherein the module comprises a memory module.

4. The module according to claim 1, wherein a height of the plurality of first contacts and a height of the plurality of second contacts is less than a height of the plurality of third contacts.

5. The module according to claim 1, wherein a spacing therebetween the plurality of first contacts and a spacing therebetween the plurality of second contacts is less than the spacing therebetween the plurality of third contacts.

6. The module according to claim 1, wherein the plurality of signals conducted to the module comprises clock signals or data signals.

7. The module according to claim 1, wherein the data signals comprise data signals having a frequency of at least about 800 Mega bits per second.

8. The module according to claim 6, wherein the data signals comprise data signals having a frequency in a range between about 800 Mega bits per second (Mbps) and about 1333 Mbps.

9. A system comprising:
   a control unit configured to conduct signals; and
   a module configured to receive a plurality of signals at a plurality of first contacts at an edge of the module, configured to conduct the plurality of signals to a plurality of second contacts at the edge and configured to conduct a plurality of address or command signals to a plurality of third contacts at the edge, wherein single one of the plurality of third contacts is dedicated to a single one of the plurality of address signals or command signals.

10. The system according to claim 9, wherein the plurality of signals received at the plurality of first contacts and conducted to the plurality of second contacts comprise clock signals or data signals.

11. The system according to claim 9, wherein the module comprises a memory module.

12. The system according to claim 10, wherein the data signals comprise data signals having a frequency of at least about 800 Mega bits per second.

13. The system according to claim 10, wherein the data signals comprise data signals having a frequency in a range between about 800 Mega bits per second (Mbps) and about 1333 Mbps.

* * * * *

UNITED STATES PATENT AND TRADEMARK OFFICE
CERTIFICATE OF CORRECTION

PATENT NO. : 7,004,759 B2  Page 1 of 1
APPLICATION NO. : 10/792475
DATED : February 28, 2006
INVENTOR(S) : Lee It is certified that error appears in the above-identified patent and that said Letters Patent is hereby corrected as shown below:

Column 8,
Line 27 should read -- 7. The module according to claim 6, wherein the data --

Line 41 should read -- a plurality of third contacts at the edge, wherein a single --

Signed and Sealed this

Eleventh Day of July, 2006

JON W. DUDAS
*Director of the United States Patent and Trademark Office*